United States Patent [19]
Liu

[11] Patent Number: 6,095,400
[45] Date of Patent: Aug. 1, 2000

[54] REINFORCED SOLDER PREFORM

[75] Inventor: Dangrong Ronald Liu, West Bloomfield, Mich.

[73] Assignee: Ford Global Technologies, Inc., Dearborn, Mich.

[21] Appl. No.: 08/985,293

[22] Filed: Dec. 4, 1997

[51] Int. Cl.[7] .......................... B23K 35/14; B23K 35/12
[52] U.S. Cl. ........................................ 228/56.3; 228/246
[58] Field of Search .................... 228/56.3, 246, 228/245, 262.3, 262.6

[56] References Cited

U.S. PATENT DOCUMENTS

| | | |
|---|---|---|
| 2,530,552 | 11/1950 | Stoddard, Jr. . |
| 2,694,852 | 11/1954 | Rogers . |
| 3,153,581 | 10/1964 | Hutchins IV . |
| 3,494,803 | 2/1970 | Avis et al. . |
| 3,535,769 | 10/1970 | Goldschmied . |
| 4,020,987 | 5/1977 | Hascoe ................................... 228/56 |
| 4,279,121 | 7/1981 | Ryan et al. ............................... 57/258 |
| 4,340,650 | 7/1982 | Pattanaik et al. ....................... 428/675 |
| 4,529,836 | 7/1985 | Powers et al. . |
| 4,640,438 | 2/1987 | Trevison et al. ........................ 220/359 |
| 4,650,107 | 3/1987 | Keser . |
| 4,806,704 | 2/1989 | Belke, Jr. et al. ..................... 174/52.4 |
| 4,819,857 | 4/1989 | Mizuishi et al. ........................ 228/121 |
| 4,871,622 | 10/1989 | Rabinkin ................................. 428/576 |
| 5,089,356 | 2/1992 | Chung .................................... 428/608 |
| 5,127,969 | 7/1992 | Sekhar ..................................... 148/23 |
| 5,176,410 | 1/1993 | Beyer ...................................... 285/187 |
| 5,427,865 | 6/1995 | Mullen, III et al. .................... 428/559 |
| 5,445,697 | 8/1995 | Fitch et al. .............................. 156/295 |
| 5,476,723 | 12/1995 | Pagnon ................................... 428/610 |
| 5,484,979 | 1/1996 | Gao .................................... 219/121.64 |
| 5,620,129 | 4/1997 | Rogren ................................... 228/56.3 |
| 5,786,068 | 8/1998 | King et al. .............................. 428/212 |
| 5,804,870 | 9/1998 | Burns ...................................... 257/666 |
| 5,881,944 | 3/1999 | Edwards et al. ....................... 228/56.3 |
| 5,957,364 | 9/1999 | Socha ..................................... 228/56.3 |

FOREIGN PATENT DOCUMENTS 06053353  2/1994  Japan .

*Primary Examiner*—Patrick Ryan
*Assistant Examiner*—Kiley Stoner
*Attorney, Agent, or Firm*—Leslie C. Hodges

[57] ABSTRACT

There is disclosed herein a solder preform for use on printed circuit boards to provide reinforced solder joints thereon. The preform 70 comprises a solder body 72 made of solder, and a thin metallic member 30 attached to the solder body 72. The member 30 may be a metallic screen or foil having holes or perforations 32 therethrough, or may be a non-perforated metallic foil. A method for producing such reinforced solder joints is also disclosed.

10 Claims, 5 Drawing Sheets

REINFORCED SOLDER PREFORM

BACKGROUND OF THE INVENTION

1. Field of the Invention

The present invention relates generally to printed circuit boards, and more particularly to printed circuit boards having surface mount electronic components.

2. Disclosure Information

One of the most common failure modes occurring in surface mount printed circuit boards (PCBs) is solder joint cracking, as illustrated in FIG. 1. This is an electrical failure which is caused when the solder joint 10 which electrically and mechanically connects a component termination 12 with its respective mounting pad 14 cracks due to thermal cycling stress induced because of the difference between the coefficients of thermal expansion of the component/termination and the mounting pad/substrate. Typically such cracks 16 initiate at the inner fillet surface 18 and propagate underneath the termination 12 and out to the outer fillet surface 20, thus electrically separating the termination 12 from its mounting pad 14. This problem is especially pronounced in such environments as automotive applications, where the PCB must be able to perform in conditions anywhere between −40° C. and 125° C.

Various approaches have been proposed for mitigating this problem, the most common being the use of higher melting point metal particles mixed into the solder to impart more thermal fatigue resistance to the solder. However, it is often difficult to consistently control the standoff height H using such an approach. Another approach is to use a leaded component rather than a leadless one, but this has the disadvantage of requiring more board space and often a higher component cost.

It would be desirable, therefore, to provide some means for improving solder joint resistance to thermal cycling fatigue and cracking without these disadvantages.

SUMMARY OF THE INVENTION

The present invention overcomes the disadvantages of the prior art by providing a solder preform for use on printed circuit board for producing reinforced solder joints thereon. The preform comprises a solder body made of solder, and a thin metallic member attached to the solder body. The thin metallic member is preferably made of a solder-wettable metal such as copper or nickel and may comprise a non-perforated metallic foil or a perforated metallic foil or screen. The present invention also includes a method for producing reinforced solder joints using such preforms.

It is an object and advantage that the present invention may be used to improve solder joint resistance to thermal cycling stress.

It is a further advantage that the present invention may improve solder joint resistance to thermal cycling stress without requiring the use of particle-filled solder or the use of leaded rather than leadless components.

These and other advantages, features and objects of the invention will become apparent from the drawings, detailed description and claims which follow.

DETAILED DESCRIPTION OF THE PREFERRED EMBODIMENTS

Figure 1:
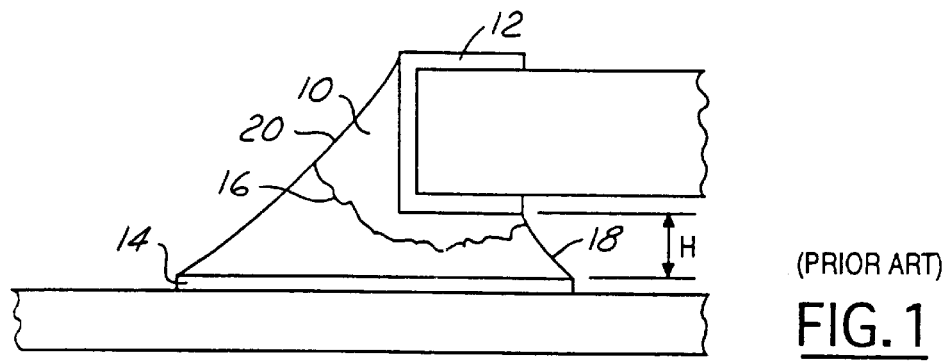
FIG. 1 is an elevation view of a solder joint having a crack failure therein according to the prior art.
Figure 2:
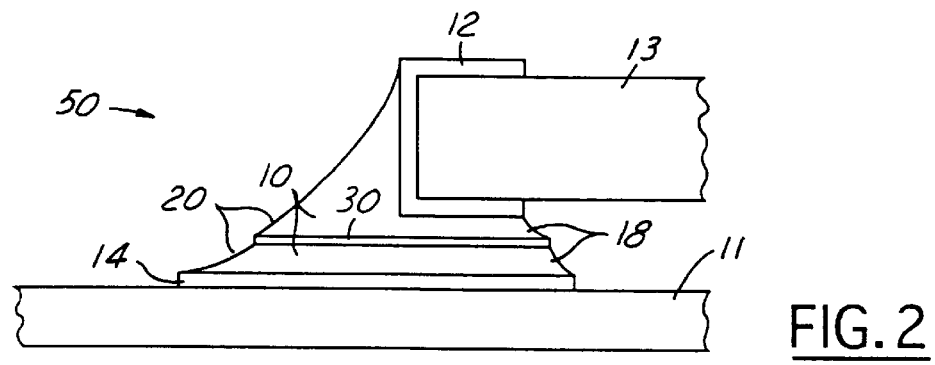
FIGS. 2–4 are elevation views of various embodiments of a reinforced solder joint according to the present invention.

Referring now to the drawings, FIG. 2 shows a PCB 50 having reinforced solder joints according to the present invention. The PCB 50 comprises: a substrate 11 having mounting pads 14 arranged thereon; a surface mount component 13 having terminations 12, with the component 13 being disposed on the substrate 11 with each termination 12 being registered atop a respective mounting pad 14; a solder joint 10 connecting each termination 12 with its respective mounting pad 14; and a thin metallic member 30 disposed within each solder joint 10 between its respective termination 12 and mounting pad 14.

Figure 5:
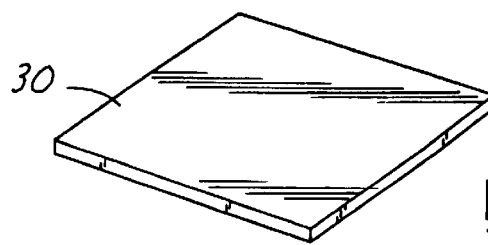
FIGS. 5–7 are perspective views of various embodiments of a thin metallic member according to the present invention.
Figure 6:
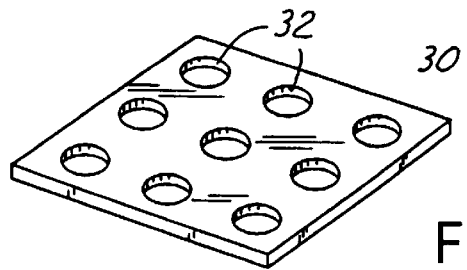
Figure 7:
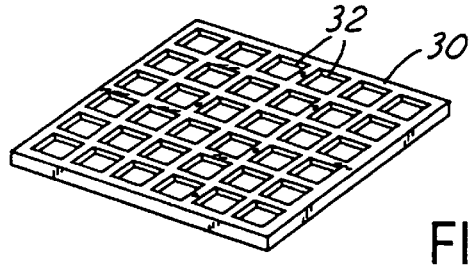

The thin metallic member 30 may be a solid (i.e., non-perforated) metallic foil as shown in FIG. 5, or it may be a metallic screen or foil having holes or perforations 32 therethrough as shown in FIGS. 6 and 7. The member 30 has a melting point above the melting point of the solder used to form the solder joint 10 and above any other elevated temperatures to which the member 30 may be exposed during processing (e.g., reflow temperatures, which are typically higher than the melting point of the solder used). Also, the member 30 should be constructed of (or at least coated with) a solder-wettable metal such as copper or nickel.

Figure 3:
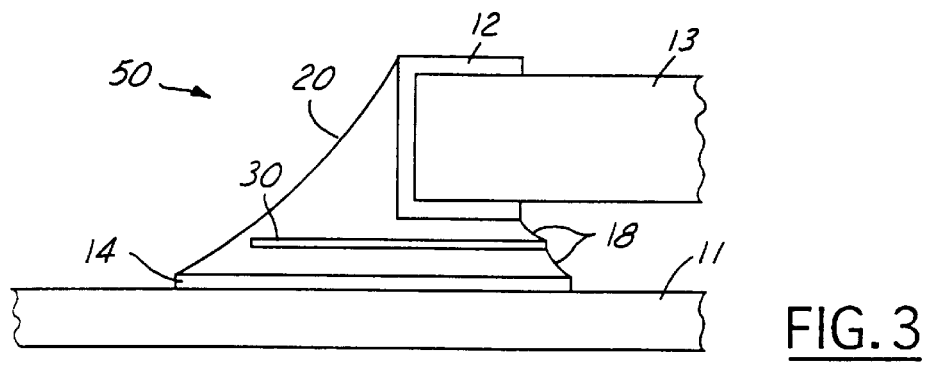
Figure 4:
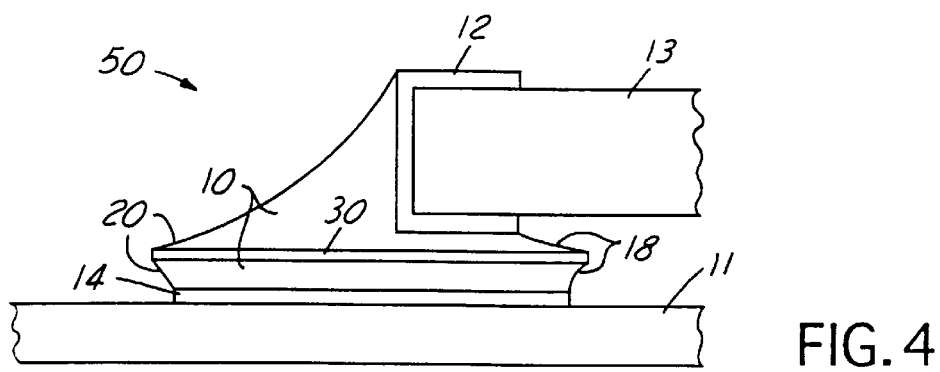

Preferably the thin metallic member 30 is substantially flat, is disposed within the joint 10 generally parallel to the top surface of its respective mounting pad 14, and is spaced apart from its respective termination 12 and its respective mounting pad 14, as illustrated in FIGS. 2–4. However, it is possible that the member 30 may be non-flat (e.g., corrugated or curved), may be oriented non-parallel to the top surface of the mounting pad, and may rest against either the termination or the mounting pad, and still be functional and within the scope of the present invention.

The size and shape of the thin metallic member 30 may be substantially the same as that of its respective mounting pad 14, or it may assume some other shape and size. For example, the mounting pad may be a 120-mil-wide by 90-mil-long rectangle, with the member 30 being substantially the same size and shape. Alternatively, for such a mounting pad, the member 30 may assume a circular shape having a diameter of 120 mils. The member 30 may assume other shapes and sizes as well, but is preferably less than 5 mils thick.

If the member 30 is smaller than its associated mounting pad 14, it may form a joint similar to FIGS. 2 or 3. In FIG. 2, the member 30 is contiguous with both the inner and outer fillets 18/20, whereas in FIG. 3 it is contiguous with only the inner fillet 18. It is also possible that the member 30 may "float" within the joint and not be contiguous with either fillet, or that the member 30 is contiguous with only the outer fillet 20; however, it is preferred that the thin metallic member 30 be contiguous with at least the inner fillet 18. If the member 30 is larger than its associated mounting pad 14, it may form a joint similar to FIG. 4. Here the member 30 is contiguous with both the inner and outer fillets 18/20. While both smaller-than-mounting-pad and larger-than-mounting-pad members 30 will work, the latter is preferred.

The present invention effectively delays or avoids the onset of crack initiation and slows down the propagation of any cracks that do initiate. This is accomplished by essentially splitting the joint 10 into two parts—that portion 10a of the solder joint above the thin metallic member 30, and that portion 10b below. The thickness of each part 10a/10b is much less than the thickness H of a conventional joint, thereby making each portion 10a/10b stronger and more resistant to both crack initiation and crack propagation. The present invention is particularly effective against stopping any mode I type cracks, which typically begin at the interior bottom edge of the termination 12 and propagate more or less downward toward the mounting pad 14; if such cracks do eventually initiate, the thin metallic member 30 stops the crack from propagating any further downward when the crack reaches the member 30.

Actual test results with PCBs having reinforced solder joints according to the present invention indicate that use of such joints on a PCB can dramatically improve the failure-free life thereof. Tests were conducted using a 2512 leadless component resistor (LCR) on a conventional FR-4 substrate having copper mounting pads thereon. The solder used was an alloy of 62% Sn, 36% Pb, and 2% Ag. The average standoff height H was 1.8 mils, using a thin metallic member 30 comprising a 0.8-mil-thick, 120-mil-diameter circular copper screen having 400- to 500-mesh. A conventional solder reflow process was used to form the solder joints.

Each PCB contained some 2512 LCRs with conventional, "control group" solder joints and other 2512 LCRs with reinforced, "test group" solder joints, to assure that both groups experienced the same test conditions. Each PCB was subjected to either 1250 or 1500 thermal cycles between −40° C. and 125° C. At the end of 1000, 1250, and 1500 cycles, samples were cross-sectioned to determine how many crack failures occurred among the samples in each group. If at least one of the two terminations of an LCR was fully cracked, then that entire LCR was deemed as a failed component. After 1000 cycles, no cracks were noticed in either group. After 1250 cycles, one out of four (¼, or 25%) of the control samples were found to have failed due to solder joint cracking, while none out of six (0/6, or 0%) of the test samples had failed. After 1500 cycles, six out of sixteen (6/16, or 37.5%) of the control samples had failed, while only two out of twenty-four (2/24, or 8.3%) of the test samples had exhibited cracking. (It should be noted that the 1 out of 4 and 6 out of 16 control samples were cracked completely through the joint, while the 2 out of 24 test samples that "failed" actually were only partially cracked and still functioned electrically.)

Figure 9:
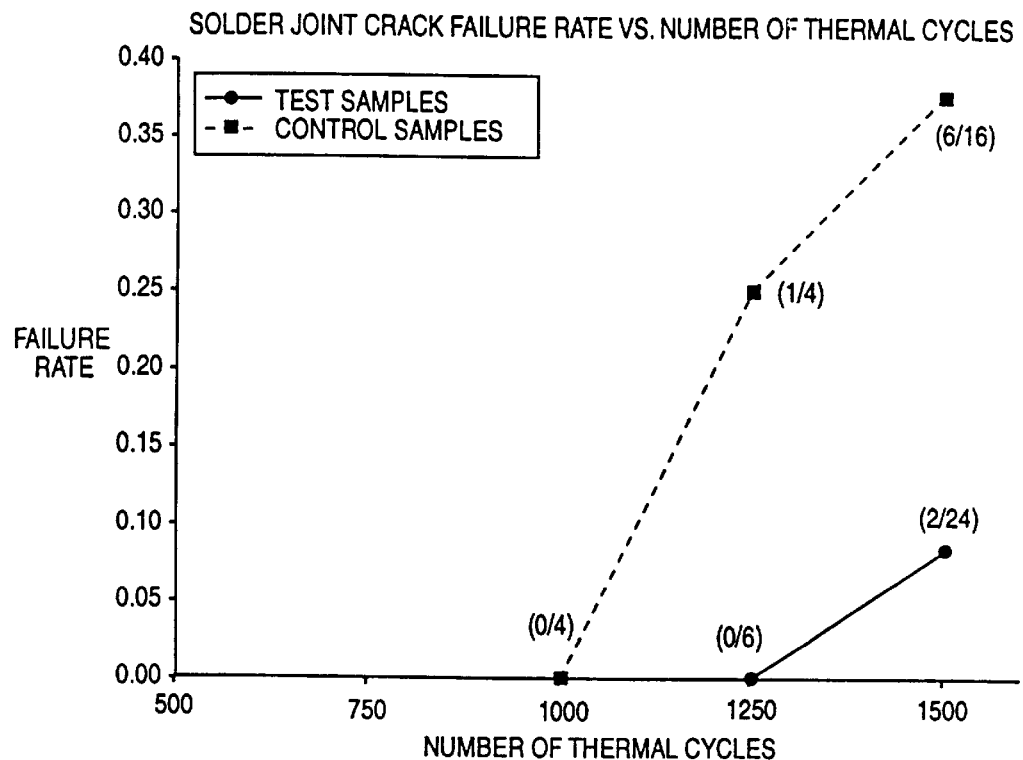
FIG. 9 is a graph of solder joint crack failure rate versus number of thermal cycles, comparing conventional solder joints against those produced according to the present invention.

These results are illustrated in FIG. 9. These test results indicate that using the reinforced solder joints of the present invention, the failure-free life of the 2512 LCR was increased by roughly 25% (i.e., from 1000 cycles up to 1250 cycles), and that the failure rate at 1500 cycles was reduced roughly by a factor of at least 4.5 (i.e., from 37.5% down to only 8.3%).

Figure 8:
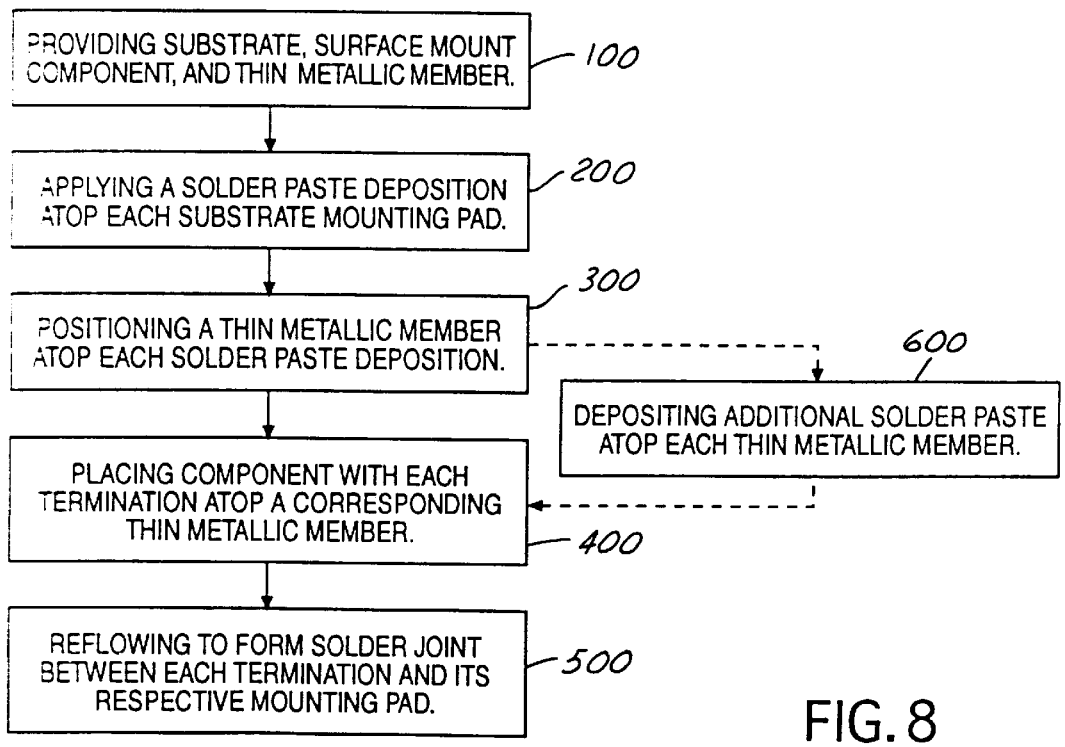
FIG. 8 is a schematic flowchart showing a method for producing a PCB having reinforced solder joints according to the present invention.

A method for producing a PCB 50 having reinforced solder joints according to the present invention is illustrated in FIG. 8 and comprises the following steps. In a first step 100, a substrate having mounting pads arranged thereon, a surface mount component having terminations, and a thin metallic member for each termination are provided. In a second step 200, a solder paste deposition is applied atop each mounting pad. In a third step 300, a thin metallic member is positioned atop each solder paste deposition. In a fourth step 400, the surface mount component is placed on the substrate such that each termination is registered atop a corresponding thin metallic member. In a fifth step 500, the solder paste is reflowed so as to form solder joints connecting each termination with its respective mounting pad. When the solder paste is reflowed, it penetrates through any holes or perforations in the member and/or wicks around the peripheral edges of the member by capillary effect, thereby providing solder to the joint both above and below the member. In the resultant joint, each thin metallic member is sandwiched between its associated termination and mounting pad. An additional step 600 of depositing additional solder paste atop each thin metallic member after the positioning step 300 and before the placing step 400 may be performed. As mentioned above, the thin metallic member should have a melting point above any temperature to which the member is exposed during the reflowing step, or during any other processing step.

Figure 10:
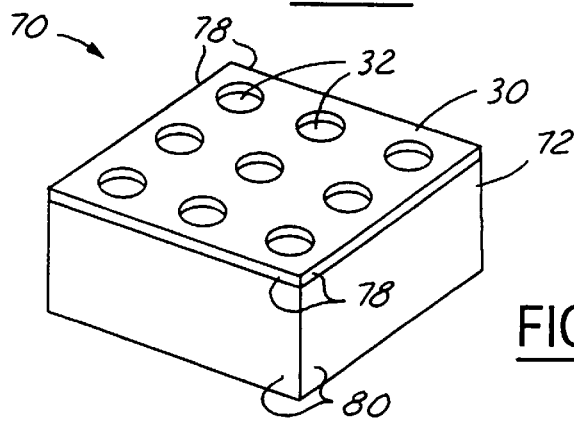
FIGS. 10–11 are perspective views of solder preforms according to the present invention.
Figure 11:
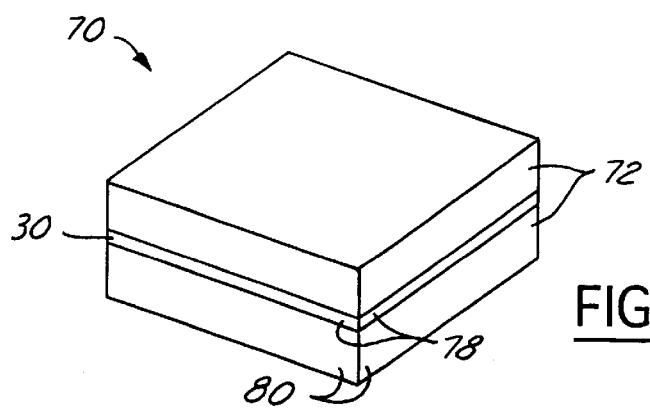

An alternative approach to using deposited solder paste is to use solder preforms instead. Such a preform 70 according to the present invention is illustrated in FIG. 10, and would comprise a solder body 72 to which a thin metallic member 30 is attached. The thin metallic member 30 here has the same characteristics as the member 30 described above; for example, it may comprise a non-perforated sheet, or a sheet or screen having holes or perforations 32 therein. The solder body 72 may assume a generally rectangular wafer shape, as illustrated in FIG. 10, or it may assume other shapes. Preferably the outer perimeter 78 of the member 30 generally conforms with the outer perimeter 80 of the solder body 72, with each having a generally rectangular profile as viewed from above (i.e., as viewed from a point generally orthogonal to a top surface of the thin metallic member 30). The member 30 may lie atop the solder body 72, as shown in FIG. 10, or it may lie within the solder body 72, as shown in FIG. 11.

Such preforms 70 may be constructed using various methods. One method is to first provide a large, flat, thin sheet of solder, such as may be formed by pouring molten solder into a mold of the desired shape and size. Second, a large, flat, thin piece of non-perforated metal foil or perforated foil/screen may be attached to the large sheet of solder. One way of attaching the foil/screen to the solder is to sandwich them together while the solder is molten and allowing the sandwich to cool, thereby forming a solder bond therebetween. This step may be facilitated by applying flux between the solder and the foil/screen, preferably by applying a thin coat of flux to the surface of the foil/screen that is to be sandwiched in contact with the solder. Third, the sandwich may then be stamped or diced so as to form a plurality of individual solder preforms 70 cut to the desired size. This process results in preforms 70 resembling that shown in FIG. 10. To produce preforms 70 similar to that shown in FIG. 11, an additional step of pouring another layer of solder atop the foil/screen may be performed before the stamping/dicing step, thus forming a solder/member/solder sandwich.

Figure 12:
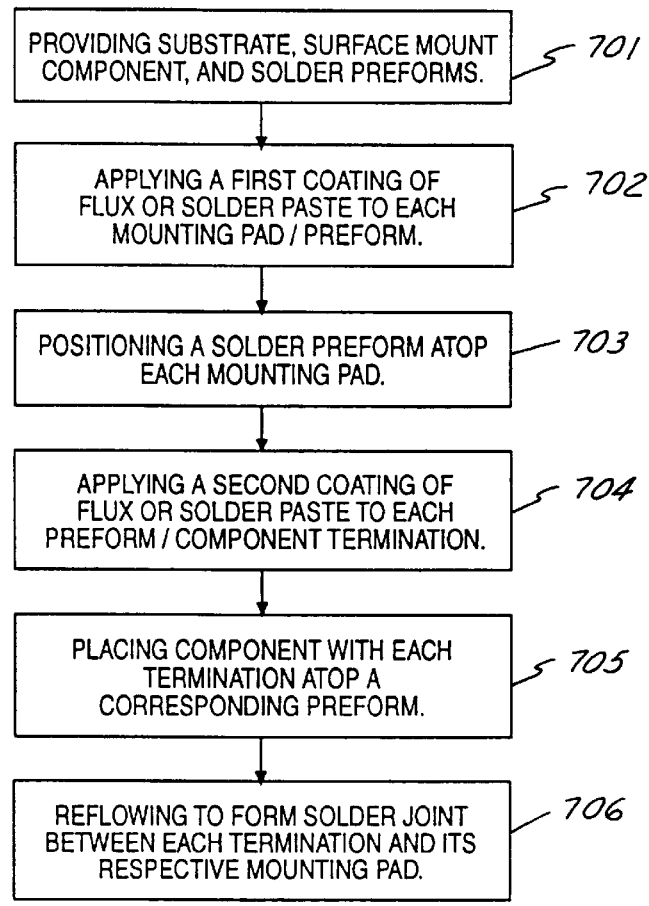
FIG. 12 is a schematic flowchart showing another method for producing a PCB having reinforced solder joints according to the present invention.

A method for using the solder preforms to form the reinforced solder joints of the present invention is shown in FIG. 12 and involves the following steps. In a first step 701, a substrate having mounting pads arranged thereon, a surface mount component having terminations, and a solder preform for each termination are provided. In a second step 702, a first coating of flux is applied to the top surface of each mounting pad and/or to the bottom surface of each preform. In a third step 703, a solder preform is positioned atop each mounting pad with the first coating of flux interposed therebetween. In a fourth step 704, a second coating of flux is applied to the top surface of each preform and/or to the bottom surface of each component termination. In a fifth step 705, the surface mount component is placed on the substrate such that each termination is registered atop a corresponding solder preform with the second layer of flux interposed therebetween. In a sixth step 706, the solder and flux are heated so as to reflow the solder and form solder joints connecting each termination with its respective mounting pad wherein each thin metallic member is sandwiched between its associated termination and mounting pad. Alternatively, rather than applying flux in steps 702 and/or 703, solder paste (i.e., solder particles suspended in flux) may be applied instead; this may provide the added benefit of providing additional solder to each joint.

Figure 13:
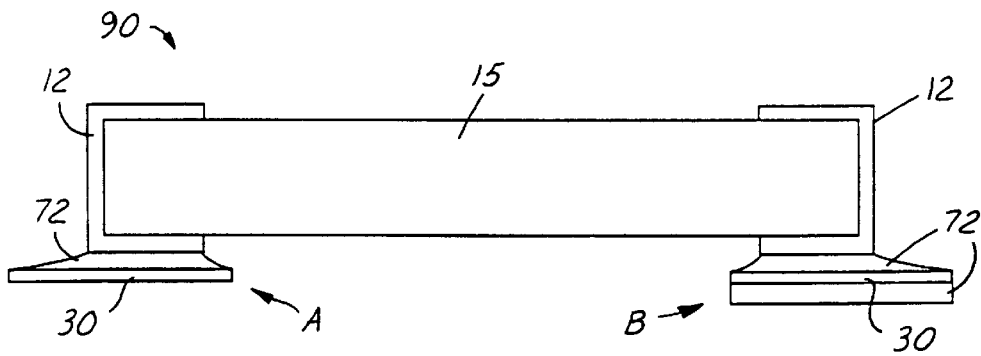
FIG. 13 is an elevation view of an electronic component having solder preforms attached thereto according to the present invention

A modification of the above approach is to attach the solder preforms 70 directly to each component termination 12, as shown in FIG. 13, prior to placing the surface mount component 13 onto the mounting pads 14. Such a component 90 comprises a component body portion 15 having peripheral terminations 12 thereon. A tinned (i.e., solder-coated) member 30—essentially a solder preform 70 as described above—is placed in contact with each component termination 12 and heat, pressure, ultrasonic vibration, etc., are used to create a solder bond between each termination 12 and its associated thin metallic member 30. Substantially all of the solder 72 may be disposed between the member 30 and the termination, as represented by joint A in FIG. 13, or it may be disposed with a significant amount on both sides of the member 30 as represented by joint B. (Normally, only one of joint types A and B would be used on a component; both are included in FIG. 13 primarily for the purpose of illustration.) This kind of component 90 may be provided on tape reels just as conventional electronic components are, for subsequent use in an automated pick-and-place machine. With the metallic member 30 already attached to each component termination 12, no separate step would be needed for placing a member 30 atop each solder paste deposition, nor for placing a preform 70 atop a flux coating.

Figure 14:
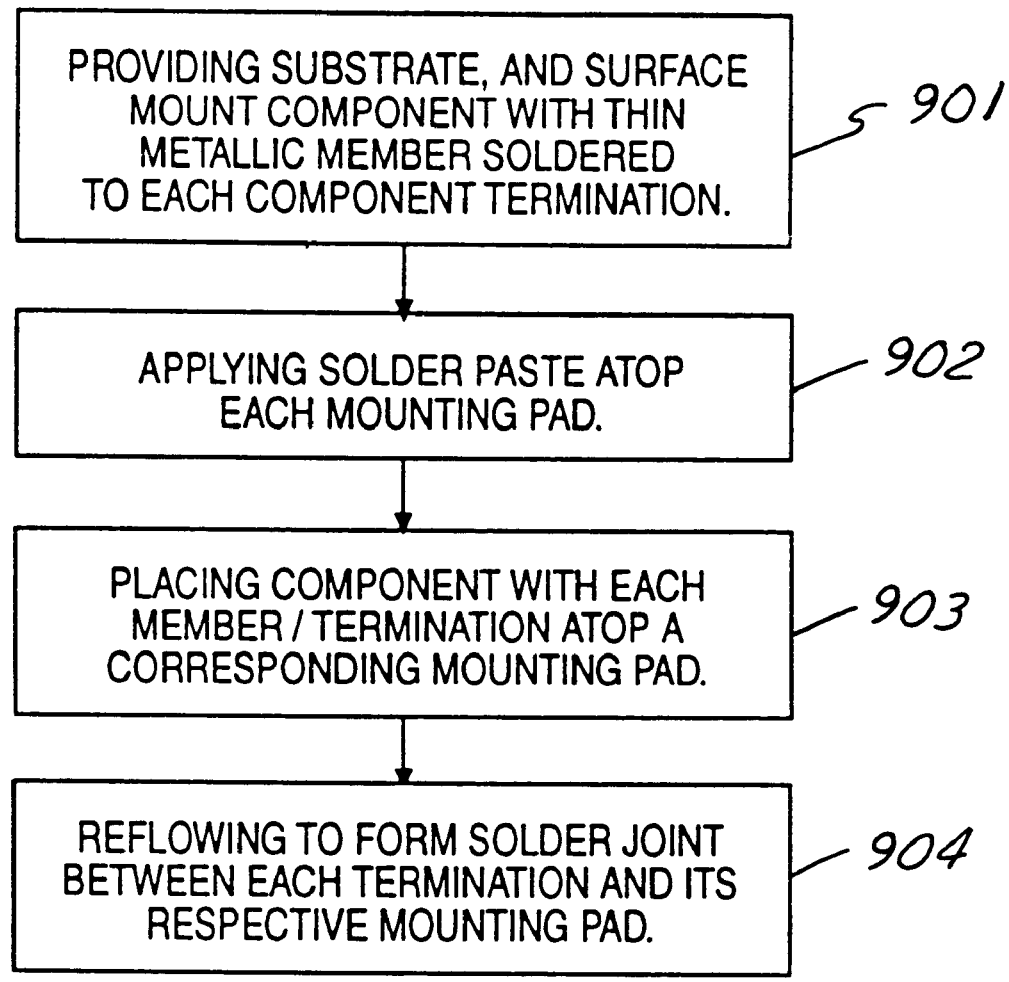
FIG. 14 is a schematic flowchart showing yet another method for producing a PCB having reinforced solder joints according to the present invention.

This kind of pre-membered component 90 could be used in a conventional reflow process with little or no modification to the conventional process, as illustrated in FIG. 14. In a first step 901, a substrate having mounting pads arranged thereon and a surface mount component having terminations are provided, wherein a thin metallic member is soldered to each termination as described above. In a second step 902, a solder paste deposition is applied atop each mounting pad. In a third step 903, the surface mount component is placed on the substrate such that each member/termination is registered atop a corresponding mounting pad. In a fourth step 904, the solder paste is reflowed so as to form solder joints connecting each termination with its respective mounting pad wherein each thin metallic member is sandwiched between its associated termination and mounting pad.

Various other modifications to the present invention will, no doubt, occur to those skilled in the art to which the present invention pertains. For example, it is possible that the thin metallic member 30 may be made from a plastic, ceramic, or non-solder-wettable metal having a surface of solder-wettable metal plated or otherwise attached thereabout. Also, the PCB 50 is not limited to conventional rigid FR-4 epoxy-glass substrates, but may include flex circuits and other flexible substrates. Furthermore, while the test results disclosed herein are for a 2512 LCR, other types of leadless (i.e., non-through-hole) surface mount components may be used according to the present invention, including J-leaded, gull-winged, and other termination configurations. It is the following claims, including all equivalents, which define the scope of the present invention.

What is claimed is:

1. A solder preform for use on printed circuit boards to provide solder joints thereon, comprising:
    a solder body made of solder; and
    a thin metallic member having an outer surface made of copper or nickel attached to said solder body.

2. A solder preform according to claim 1, wherein said thin metallic member has a melting point above a melting point of said solder body.

3. A solder preform according to claim 1, wherein said thin metallic member is a metallic screen or foil having perforations therethrough.

4. A solder preform according to claim 1, wherein said thin metallic member is a non-perforated metallic foil.

5. A solder preform according to claim 1, wherein said thin metallic member is disposed on a top surface of said solder body.

6. A solder preform according to claim 1, wherein said thin metallic member is disposed within said solder body.

7. A solder preform according to claim 1, wherein said thin metallic member is substantially flat.

8. A solder preform according to claim 1, wherein an outer perimeter of said thin metallic member generally conforms with an outer perimeter of said solder body.

9. A solder preform according to claim 1, wherein an outer perimeter of said thin metallic member and an outer perimeter of said solder body are each generally rectangular.

10. A solder preform for use on printed circuit boards to provide solder joints thereon, comprising:
    a solder body made of solder; and
    a thin metallic member having an outer surface made of a non-solder solder-wettable material attached to said solder body, said thin metallic member formed of a metallic screen or foil having perforations therethrough.

* * * * *